(12) United States Patent
Koshihara et al.

(10) Patent No.: US 9,502,482 B2
(45) Date of Patent: Nov. 22, 2016

(54) ELECTRO-OPTICAL DEVICE AND ELECTRONIC APPARATUS

(71) Applicant: SEIKO EPSON CORPORATION, Tokyo (JP)

(72) Inventors: Takeshi Koshihara, Matsumoto (JP); Hisakatsu Sato, Sakata (JP); Takeshi Nomura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/865,695

(22) Filed: Sep. 25, 2015

(65) Prior Publication Data

US 2016/0013258 A1   Jan. 14, 2016

Related U.S. Application Data

(63) Continuation of application No. 13/890,635, filed on May 9, 2013, now Pat. No. 9,184,347.

(30) Foreign Application Priority Data

May 15, 2012   (JP) ................. 2012-111568

(51) Int. Cl.
*H01L 27/32* (2006.01)
*H01L 33/40* (2010.01)
*H01L 51/52* (2006.01)

(52) U.S. Cl.
CPC ....... *H01L 27/3248* (2013.01); *H01L 27/3272* (2013.01); *H01L 33/405* (2013.01); *H01L 51/5206* (2013.01); *H01L 51/5221* (2013.01); *H01L 51/5265* (2013.01); *H01L 51/5271* (2013.01); *H01L 2251/301* (2013.01); *H01L 2251/303* (2013.01); *H01L 2251/308* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 2002/0008800 | A1 | 1/2002 | Matsumoto et al. |
| 2004/0004434 | A1 | 1/2004 | Nishi et al. |
| 2004/0263441 | A1* | 12/2004 | Tanaka ............ G09G 3/325 345/76 |

(Continued)

FOREIGN PATENT DOCUMENTS

| | | |
|---|---|---|
| JP | 2002-040482 A | 2/2002 |
| JP | 2009-229778 A | 10/2009 |

(Continued)

*Primary Examiner* — Steven Loke
*Assistant Examiner* — Juanita Rhodes
(74) *Attorney, Agent, or Firm* — Oliff PLC

(57) ABSTRACT

An electro-optical device includes a reflective layer, a light emitting element including a light emitting layer formed between an anode and a cathode, and a driving transistor configured to control a current flowing through the light emitting element. In the same layer as the reflective layer, a relay electrode included in a current path from the driving transistor to the anode is formed with a gap between the relay electrode and the reflective layer. A contact electrode electrically connecting the relay electrode and the anode is formed as a light shielding layer that blocks light entering the gap.

16 Claims, 6 Drawing Sheets

(56) References Cited

U.S. PATENT DOCUMENTS

| | | | |
|---|---|---|---|
| 2004/0263711 A1 | 12/2004 | Matsumoto et al. | |
| 2005/0258437 A1 | 11/2005 | Young | |
| 2006/0124940 A1 | 6/2006 | Miyazawa | |
| 2012/0261684 A1* | 10/2012 | Koshihara | H01L 51/5265 257/89 |

FOREIGN PATENT DOCUMENTS

| | | | |
|---|---|---|---|
| JP | 2010-020926 A | | 1/2010 |
| JP | 2010020926 A | * | 10/2010 |
| JP | 2012-227247 A | | 11/2012 |
| TW | I313145 B | | 8/2009 |

* cited by examiner

ELECTRO-OPTICAL DEVICE AND ELECTRONIC APPARATUS

This Application is a Divisional Application of U.S. patent application Ser. No. 13/890,635, filed May 9, 2013, which claims the benefit of priority of Japanese Patent Application No. 2012-111568, filed on May 15, 2012.

BACKGROUND

1. Technical Field

The present invention relates to an electro-optical device and an electronic apparatus that are effective for reduction of degradations in display quality associated with light leakage, for example.

2. Related Art

Various types of electro-optical devices using light emitting elements such as organic light emitting diodes (hereinafter referred to as "OLEDs") have recently been proposed. In the configuration of such an electro-optical device, typically, pixel circuits including the light emitting elements mentioned above, transistors, and other components are arranged at positions corresponding to intersections of scanning lines and data lines, and the pixel circuits are provided so as to correspond to pixels of an image to be displayed. A pixel circuit using an OLED typically includes a write transistor that determines whether or not a data signal is able to be input from a data line, a driving transistor that determines, on the basis of the data signal, the amount of a current to be supplied to the OLED, and a storage capacitor that holds a data signal supplied from the data line. Furthermore, there is a technology using more elements for the purpose of achieving high image quality (for example, refer to JP-A-2010-20926).

An electro-optical device as mentioned above has a configuration in which a driving transistor, a power supply wiring line, an intermediate insulating film, an OLED element, and the like are formed in multiple layers, and the source or drain of the driving transistor and the anode 51 of the OLED element are connected using relay electrodes and contact holes formed in the layers. Also, a top-emission pixel circuit has a configuration in which an optical adjustment layer and an insulating layer are formed in layers lower than an OLED element, and a reflective layer is formed in a still lower layer. Then, in the same layer as the reflective layer, a relay electrode connected from the source or drain of the driving transistor mentioned above is disposed with an insulating film interposed between the reflective layer and the relay electrode, and this relay electrode is connected to the anode 51 of the OLED element. Accordingly, when such a top-emission pixel circuit is seen in plan view, there is a gap between the reflective layer and the relay electrode, suitable luminance has sometimes not been obtained because some of the incident light has leaked into the gap. As a result, luminance unevenness is visually recognized, which leads to a reduction in display quality.

SUMMARY

An advantage of some aspects of the invention is that it reduces degradations in image quality associated with light leakage.

An electro-optical device according to an aspect of the invention includes a reflective layer, a light emitting element including a light emitting layer formed between an anode 51 and a cathode 53, and a driving transistor configured to control a current flowing through the light emitting element. In the same layer as the reflective layer, a relay electrode included in a current path from the driving transistor to the anode 51 is formed with a gap between the relay electrode and the reflective layer. A contact electrode electrically connecting the relay electrode and the anode 51 is formed as a light shielding layer that blocks light entering the gap. An electro-optical device according to another aspect of the invention includes a plurality of scanning lines and a plurality of data lines intersecting each other, a plurality of pixel circuits provided at positions corresponding to intersections of the scanning lines and the data lines, and a power supply wiring line that supplies a given potential, the power supply wiring line being provided at a position corresponding to each of the plurality of pixel circuits. The scanning line, the data line, and the power supply wiring line are formed in the same layer or different layers of a plurality of layers. Each of the plurality of pixel circuits includes a reflective layer, a light emitting element including an anode 51, a light emitting layer formed on the anode 51, and a cathode 53, and a driving transistor configured to control a current flowing through the light emitting element. In the same layer as the reflective layer, a relay electrode included in a signal transmission path to the anode 51 is formed with a gap between the relay electrode and the reflective layer. A contact electrode electrically connecting the relay electrode and the anode 51 is formed as a light shielding layer that blocks light entering the gap.

According to the aspects of the invention, the relay electrode formed in the same layer as the reflective layer and the anode 51 of the light emitting element are connected by the contact electrode. Also, the relay electrode is formed with a gap between the relay electrode and the reflective layer. However, the contact electrode is formed as a light shielding layer covering the gap. Accordingly, light from a light emitting region of the light emitting element is blocked by this light shielding layer. This enables light to be prevented from invading a pixel circuit formed in a lower layer than the relay electrode. As a result, a malfunction may be prevented and display quality may be improved. Moreover, the contact electrode is operated as the light shielding layer, and therefore a special configuration need not be added in order to block light invading the gap. This allows the configuration of the electro-optical device to be simplified.

In the electro-optical device described above, it is preferable that the light shielding layer is formed so as to be located on the optical path of light that enters from an edge on a side of the relay electrode of the light emitting layer toward an edge on a side of the reflective layer of the gap. In this case, of light that enters from the edge on the relay electrode side of the light emitting layer to the anode 51, light that enters at an angle closer to the vertical direction than the optical path of light that reaches the edge on the reflective layer side of the gap will not reach the gap. Of light that enters from the edge on the relay electrode side of the light emitting element to the anode 51, light that enters at an angle closer to the horizontal direction than the optical path of light that reaches the edge on the reflective layer side of the gap is blocked by the light shielding layer. Accordingly, this light shielding layer eliminates incidence of light from the light emitting region of the light emitting element into the gap. Thus, a malfunction is prevented and display with accurate luminance is performed.

In the electro-optical device described above, it is preferable that the reflective layer is formed of the same conductive material as the relay electrode, and a given potential is supplied to the reflective layer. In this case, since the given potential is supplied to the reflective layer, noise will be shielded by the reflective layer. This enables an accurate current to be supplied to the light emitting element, and thus display quality may be improved.

Note that the invention may be conceptualized as an electro-optical device as well as a method of driving an electro-optical device or an electronic apparatus including the electro-optical device. Typical examples of the electronic apparatus include display devices such as a head-mounted display (HMD) and an electronic viewfinder.

BRIEF DESCRIPTION OF THE DRAWINGS

The invention will be described with reference to the accompanying drawings, wherein like numbers reference like elements.

FIG. 6 is a perspective view illustrating an HMD using the electro-optical device according to the embodiment or the like.

DESCRIPTION OF EXEMPLARY EMBODIMENT

Hereinafter, an exemplary embodiment of the invention will be described with reference to the accompanying drawings.

Embodiment

Figure 1:
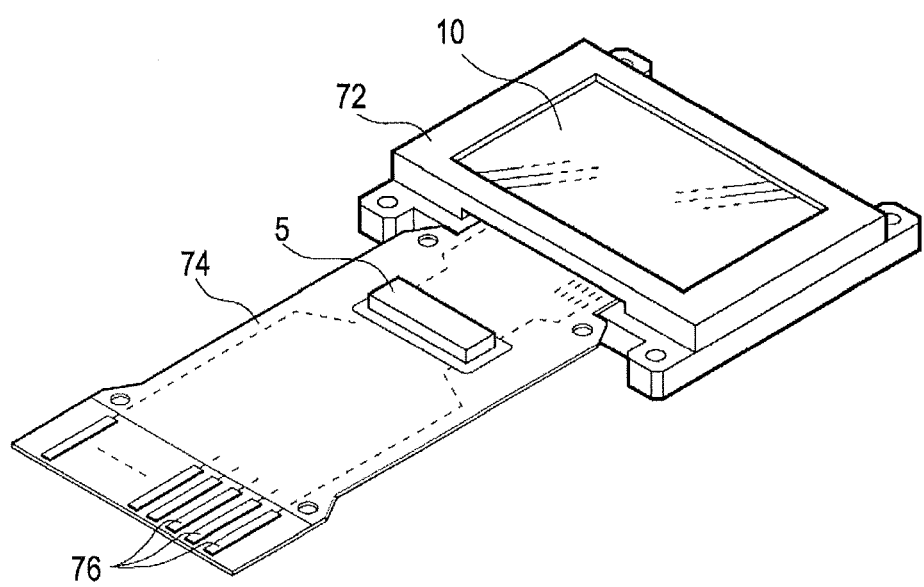
FIG. 1 is a perspective view illustrating a configuration of an electro-optical device according to an embodiment of the invention.

FIG. 1 is a perspective view illustrating a configuration of an electro-optical device 10 according to an embodiment of the invention. The electro-optical device 10 is a microdisplay that displays an image in a head-mounted display (HMD), for example. The electro-optical device 10, details of which will be described below, is an organic electroluminescent (EL) device in which a plurality of pixel circuits, driving circuits for driving the pixel circuits, and other components are formed in a silicon substrate, for example. An OLED, which is an exemplary light emitting element, is used in the pixel circuit. The electro-optical device 10 is mounted in a frame-shaped case 72 having an opening for a display section. One end of a flexible printed circuit (FPC) substrate 74 is connected to the electro-optical device 10. A control circuit 5 of a semiconductor chip is mounted on the FPC substrate 74 using a chip-on-film (COF) technology. The FPC substrate 74 is provided with a plurality of terminals 76 so as to be connected to a higher-level circuit, which is not illustrated. From the higher-level circuit, image data is supplied via the plurality of terminals 76 in synchronization with synchronizing signals. The synchronizing signals include vertical synchronizing signals, horizontal synchronizing signals, and dot clock signals. In the image data, the gray scale levels of pixels of an image to be displayed are defined in 8 bits, for example. The control circuit 5 performs both functions of a power supply circuit and a data signal output circuit of the electro-optical device 10. That is, the control circuit 5 supplies various control signals and various potentials generated in accordance with the synchronizing signals to the electro-optical device 10, and also converts digital image data to analog data signals and supplies the signals to the electro-optical device 10.

Figure 2:
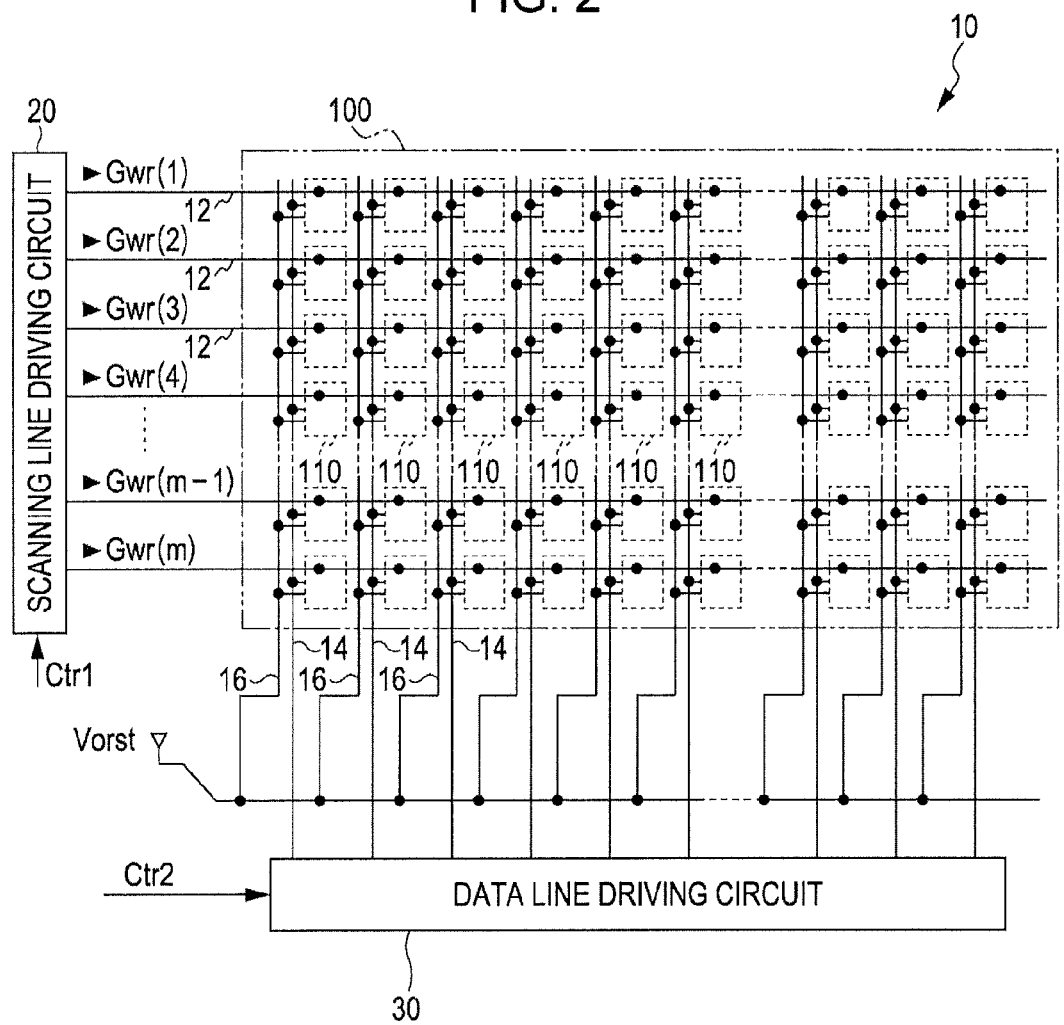
FIG. 2 is a block diagram illustrating a configuration of the electro-optical device.

FIG. 2 illustrates a configuration of the electro-optical device 10 according to one embodiment of the invention. As illustrated in this drawing, the electro-optical device 10 is broadly divided into a scanning line driving circuit 20, a data line driving circuit 30, and a display section 100. In the display section 100, among the aforementioned, pixel circuits 110 corresponding to pixels of an image to be displayed are arranged in a matrix. In particular, in the display section 100, m scanning lines 12 are provided in such a manner as to extend in the horizontal direction in the drawing, whereas n data lines 14 are provided in such a manner as to extend in the vertical direction in the drawing and in such a manner that their electrical isolation from the scanning lines 12 is maintained. The pixel circuits 110 are provided at positions corresponding to intersections of the m scanning lines 12 and the n data lines 14. For this reason, in this embodiment, the pixel circuits 110 are arranged in a matrix with m rows (horizontal lines) and n columns (vertical lines).

Here, both m and n are natural numbers. In order to distinguish individual rows in the scanning lines 12 and the matrix of the pixel circuits 110, the rows may be referred to as the 1-st, 2-nd, 3-rd, . . . , (m−1)-th, and m-th row, respectively, in order from the top of the drawing. Likewise, in order to distinguish individual columns in the data lines 14 and the matrix of the pixel circuits 110, the columns may be referred to as the 1-st, 2-nd, 3-rd, . . . , (n−1)-th, and n-th column, respectively, in order from the left side of the drawing.

In this embodiment, an initializing power supply line 16 is provided along the data line 14 for each column. A potential Vorst, which is a reset potential for initialization, is supplied in common to all the power supply lines 16.

Now, control signals as described below are supplied to the electro-optical device 10 by the control circuit 5. In particular, a control signal Ctr1 for controlling the scanning line driving circuit 20 and a control signal Ctr2 for controlling the data line driving circuit 30 are supplied to the electro-optical device 10.

In accordance with the control signal Ctr1, the scanning line driving circuit 20 generates scanning signals for scanning the scanning lines 12 sequentially, row by row, over the period of a frame. Here, the scanning signals supplied to the 1-st, 2-nd, 3-rd, . . . , (m−1)-th, and m-th scanning lines 12 are denoted by Gwr(1), Gwr(2), Gwr(3), . . . , Gwr(m−1), and Gwr(m), respectively. Note that, in addition to the scanning signals Gwr(1) to Gwr(m), the scanning line driving circuit 20 generates various control signals in synchronization with each of these scanning signals, row by row, and supplies the signals to the display section 100. These control signals are not illustrated in FIG. 2. The period of a frame is a period that is needed for the electro-optical device 10 to display an image corresponding to one cut. For example, when the frequency of a vertical synchronizing signal, which is included in a synchronizing signal, is 120 Hz, the period of a frame is 8.3 milliseconds corresponding to one period of the frequency.

Using the data line driving circuit 30, data signals are supplied for the pixel circuits 110 located in a row selected by the scanning line driving circuit 20. Data signals Vd(1), Vd(2), . . . , Vd(n) of potential levels in accordance with gray scale data of these pixel circuits 110 are supplied to the 1-st, 2-nd, . . . , n-th data lines 14 by the control circuit 5, respectively.

Figure 3:
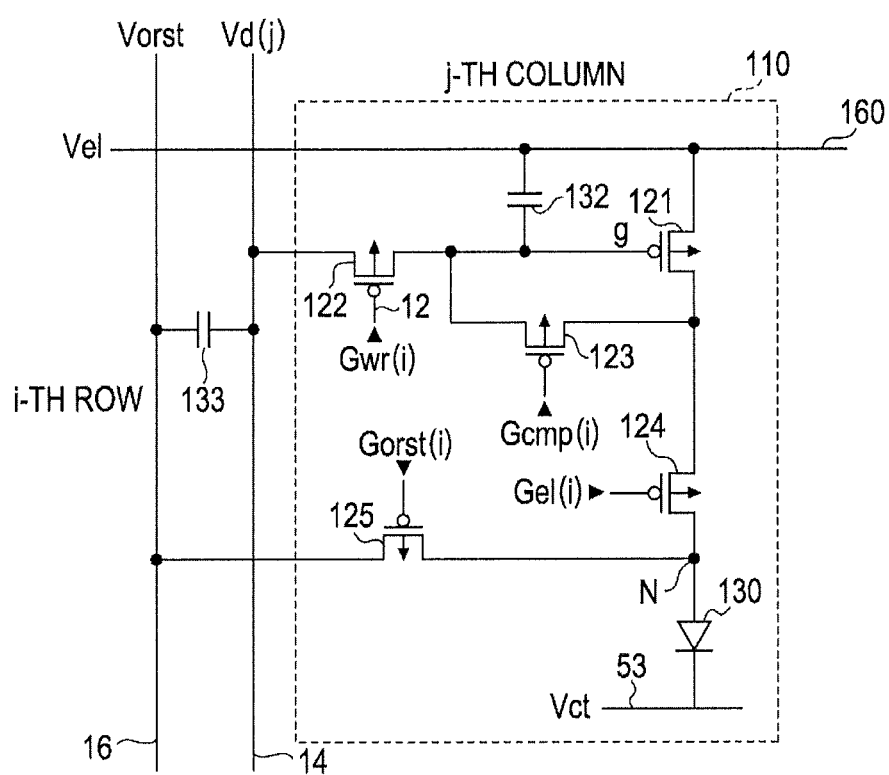
FIG. 3 is a diagram illustrating a pixel circuit in the electro-optical device.

With reference to FIG. 3, the pixel circuits 110 will now be described. Note that FIG. 3 illustrates the pixel circuit 110 corresponding to one pixel at a position corresponding to an intersection between the i-th scanning line 12 and the j-th data line 14. Here, "i" is a mark generally indicating a row in which the pixel circuits 110 are arranged, and is an integer from 1 to m. Likewise, "j" is a mark generally indicating a column in which the pixel circuits 110 are arranged, and is an integer from 1 to n.

As illustrated in FIG. 3, the pixel circuit 110 includes p-channel metal-oxide semiconductor (MOS) transistors 121 to 125, an OLED 130, and a storage capacitor 132. All the pixel circuits 110 have an identical configuration, and therefore the pixel circuit 110 located at the i-th row and the j-th column (hereinafter referred to as the "i-th row and j-th column pixel circuit 110") will be described as a representative example.

In the i-th row and j-th column pixel circuit 110, the transistor 122 functions as a write transistor. The gate node of the transistor 122 is connected to the i-th scanning line 12. One of the drain and source nodes of the transistor 122 is connected to the j-th data line 14, and the other is connected to a gate node g of the transistor 121, to an end of the storage capacitor 132, and to a drain node of the transistor 123. Here, the gate node of the transistor 121 is denoted by "g" in order to distinguish it from other nodes. A scanning signal Gwr(i) is supplied to the i-th scanning line 12, that is, to the gate node of the transistor 122.

The transistor 121 functions as a driving transistor. The source node of the transistor 121 is connected to a high potential power supply line 160, and the drain node of the transistor 121 is connected to a source node of the transistor 123 and to a source node of the transistor 124. Here, a potential Vel, which is on the high side of a power supply in the pixel circuit 110, is supplied to the high potential power supply line 160.

The transistor 123 functions as a compensation transistor. A control signal Gcmp(i) is supplied to the gate node of the transistor 123. The transistor 124 functions as a light emitting control transistor. A control signal Gel(i) is supplied to the gate node of the transistor 124, and the drain node of the transistor 124 is connected to a source node of the transistor 125 and to the anode 51 of the OLED 130.

The transistor 125 functions as an initializing transistor. A control signal Gorst(i) is supplied to the gate node of the transistor 125, and the drain node of the transistor 125 is connected to the initializing power supply line 16 corresponding to the j-th column and is maintained at the potential Vorst.

The other end of the storage capacitor 132 is connected to the high potential power supply line 160. For this reason, the storage capacitor 132 holds a source-to-drain voltage of the transistor 121. Note that, as the storage capacitor 132, a parasitic capacitance at the gate node g of the transistor 121 may be used, or a capacitance formed by sandwiching an insulating layer between conductive layers that are different from each other may be used.

Since the electro-optical device 10 is formed on a silicon substrate in this embodiment, the substrate potential of the transistors 121 to 125 is defined as the potential Vel.

The anode 51 of the OLED 130 is a pixel electrode provided individually for each pixel circuit 110. In contrast, the cathode 53 of the OLED 130 is a common electrode, which is provided common to all the pixel circuits 110, and is maintained at a potential Vct, which is on the low side of the power supply in the pixel circuit 110. The OLED 130 is an element in which an organic EL layer for emitting white light is sandwiched between the anode 51 and the cathode 53 having light transmittance in the above-mentioned silicon substrate. In addition, a color filter corresponding to any of red (R), green (G), and blue (B) is overlaid on an emission side (the cathode 53 side) of the OLED 130. In the OLED 130 as such, when a current flows from the anode 51 to the cathode 53, holes injected from the anode 51 and electrons injected from the cathode 53 recombine together in the organic EL layer, thereby creating excitons. Thus, white light is emitted. With such a structure, white light emitted at this point is transmitted through the cathode 53 on a side opposite to the silicon substrate (anode 51) side, and is changed in color by the color filter. Thus, the white light is visually recognized on the side of an observer.

Operations of Electro-Optical Device

Figure 4:
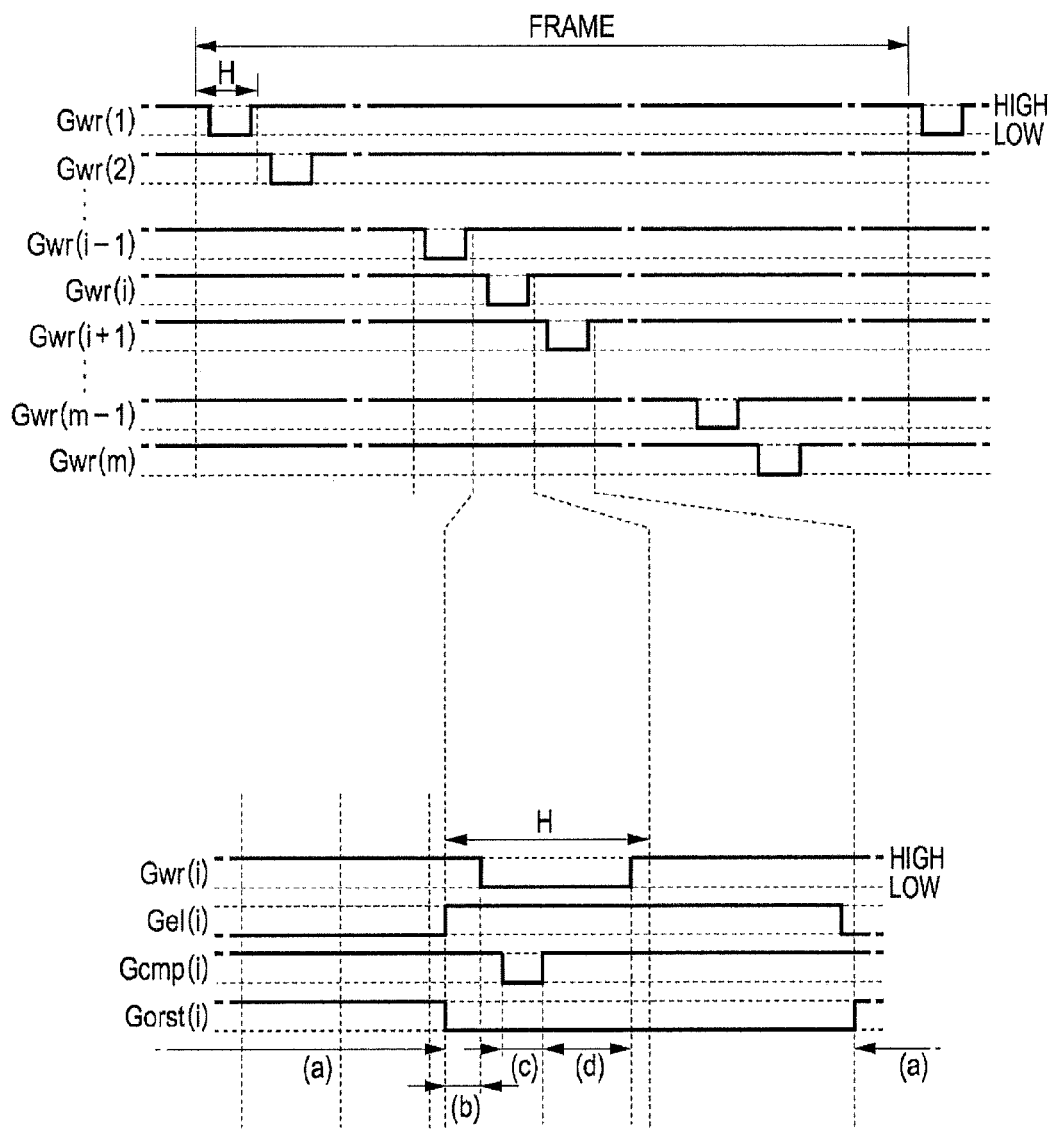
FIG. 4 is a timing chart illustrating operations of the electro-optical device.

With reference to FIG. 4, operations of the electro-optical device 10 will be described next. FIG. 4 is a timing chart for explaining operations of components in the electro-optical device 10. As illustrated in the drawing, the scanning signals Gwr(1) to Gwr(m) are sequentially switched to level L, and the 1-st to m-th scanning lines 12 are scanned in turn during the period of one frame in such a manner that one scanning line is scanned for each horizontal scanning period (H). Operations during one horizontal scanning period (H) are common to the pixel circuits 110 of each row. In view of this, paying attention particularly to the i-th row and j-th column pixel circuit 110, the operations during the scanning period when the i-th scanning line is horizontally scanned (hereinafter referred to as an "i-th row scanning period") will be described below.

In this embodiment, the i-th row scanning period is broadly divided into an initialization period denoted by (b), a compensation period denoted by (c), and a writing period denoted by (d), in FIG. 4. Then, after an interval subsequent to the writing period of (d), a light emitting period denoted by (a) commences. After a lapse of the period of one frame, the i-th row scanning period commences again. Accordingly, in terms of temporal order, a cycle of (light emitting period) →initialization period→compensation period→writing period→(light emitting period) is repeated.

Light Emitting Period

For the sake of explanatory convenience, the light emitting period, which is a precondition of the initialization period, will be described at the beginning. As illustrated in FIG. 4, in the i-th row light emitting period, the scanning signal Gwr(i) is at level H and the control signal Gel(i) is at level L. Among the control signals Gel(i), Gcmp(i), and Gorst(i), which are logic signals, the control signal Gel(i) is at level L and the control signals Gcmp(i) and Gorst(i) are at level H. Therefore, in the i-th row and j-th pixel circuit 110 illustrated in FIG. 3, the transistor 124 is on whereas the transistors 122, 123, and 125 are off. Accordingly, the transistor 121 supplies a current Ids in accordance with a gate-to-source voltage Vgs to the OLED 130. As described below, in this embodiment, the voltage Vgs during the light emitting period is level-shifted in accordance with the potential of a data signal from a threshold voltage of the transistor 121. The current having a value in accordance with a gray scale level is therefore supplied to the OLED 130 in such a manner that the threshold voltage of the transistor 121 is compensated for.

Note that since the i-th row light emitting period is a period during which scanning lines of rows other than the i-th row are horizontally scanned, the potential of the data line 14 suitably varies. In the i-th row pixel circuit 110, however, since the transistor 122 is off, the potential variation of the data line 14 is not taken into consideration here.

Initialization Period

Then, when the i-th row scanning period commences, the initialization period of (b) starts at the beginning as a first period. In the initialization period, the levels of the control signal Gel(i) and the control signal Gorst(i) change to level H and level L, respectively, from those in the light emitting period. Therefore, in the i-th row and j-th pixel circuit 110 illustrated in FIG. 3, the transistor 124 is turned off, whereas the transistor 125 is turned on. This cuts off a path through which a current is supplied to the OLED 130, and resets the anode 51 of the OLED 130 to the potential Vorst. Since the OLED 130 has a structure in which the anode 51 and the cathode 53 sandwich an organic light emitting layer as described above, there exists a parasitic capacitance the parasitic capacitance being between the anode 51 and the cathode 53, in parallel to the anode 51 and the cathode 53. When a current is flowing through the OLED 130 during the light emitting period, an anode 51-to-cathode 53 voltage across the OLED 130 is held by this capacitance. The held voltage, however, is reset by the transistor 125 turning on. For this reason, in this embodiment, when a current flows again to the OLED 130 in the next light emitting period, the current flow is less likely to be affected by the voltage held by that capacitance.

In particular, when the display state changes from a high-luminance state to a low-luminance state, for example, a high voltage in the high-luminance state (in which a large amount of current flows) is held if a pixel circuit has a configuration that does not allow for resetting. Even if an attempt is made to allow a small amount of current to flow subsequently, an excessive current flows in reality, making it impossible to achieve a low-luminance state. In contrast, the potential of the anode 51 of the OLED 130 is reset by the transistor 125 turning on in this embodiment. This results in enhanced reproducibility of the low-luminance side. Note that, in this embodiment, the potential Vorst is set such that the difference between the potential Vorst and the potential Vct of the cathode 53 is less than a light emitting threshold voltage of the OLED 130. For this reason, in the initialization period (as well as the compensation period and the writing period, which will be described below), the OLED 130 is in the off (non-light emitting) state.

Compensation Period

The compensation period of (c) next commences as a second period in the i-th row scanning period. In the compensation period, the levels of the scanning signal Gwr(i) and the control signal Gcmp(i) change to level L from those in the initialization period. In the compensation period, however, a control signal /Gini is at level H under the condition that the control signal Gref remains at level H. During the compensation period, the transistor 123 is on, and therefore the transistor 121 is diode-connected. For this reason, a drain current flows through the transistor 121 to charge the gate node g and the data line 14. In particular, a current flows through a path of the high potential power supply line 160→the transistor 121→the transistor 123→the transistor 122→the j-th data line 14. Accordingly, turning on of the transistor 121 causes rises in the potentials of the data line 14 and the gate node g that are in a state of mutual connection. However, assuming that the threshold voltage of the transistor 121 is |Vth|, the closer the gate node g approaches a potential (Vel−|Vth|), the less a current is likely to flow through the above path, and therefore the data line 14 and the gate node g are saturated at a potential (Vel−|Vth|) by the time the compensation period is completed. Accordingly, the storage capacitor 132 holds the threshold voltage |Vth| of the transistor 121 by the time the compensation period is completed.

Writing Period

Subsequent to the compensation period, the writing period of (d) commences as a third period. During the writing period, the control signal Gcmp(i) changes to level H, and therefore the transistor 121 is not diode-connected. The potential in the path from the j-th data line 14 to the gate node g in the i-th row and j-th column pixel circuit 110 is maintained at (Vel−|Vth|) owing to the storage capacitor 132.

Light Emitting Period

After an interval for one horizontal scanning period subsequent to completion of the writing period for the i-th row, a light emitting period commences. In the light emitting period, since the level of the control signal Gel(i) changes to level L as mentioned above, the transistor 124 is turned on in the i-th row and j-th column pixel circuit 110. The current having a value in accordance with a gray scale level is supplied to the OLED 130 in such a manner that the threshold voltage of the transistor 121 is compensated for. Such operations are also performed in the i-th row pixel circuits 110 other than the i-th row and j-th column pixel circuit 110 temporally in parallel during the i-th row scanning period. Moreover, in reality, such operations in the i-th row are performed in the order of the 1-st, 2-nd, 3-rd, . . . , (m−1)-th, and m-th row over a period of one frame, and are repeated frame by frame.

Regarding the pixel circuit 110 described above, in reality, a parasitic capacitance exists between the data line 14 and the gate node g of the pixel circuit 110. Accordingly, if the range of variations in potential of the data line 14 is large, the variations spread through the parasitic capacitance to the gate node g, thereby generating so-called cross talk, unevenness, or the like. This results in a reduction in display quality. The effect of the parasitic capacitance markedly increases when the pixel circuit 110 is miniaturized. In this embodiment, however, as described below, a connection portion between the gate electrode of the transistor 121 and another transistor or the storage capacitor is surrounded on four sides by the initializing power supply line 16. Even if noise occurs because of variations in the potential of the data line 14 or other reasons, the noise has no influence on the connection portion between the gate electrode of the transistor 121 and another transistor or the storage capacitor. Thus, variations in the potential of the gate electrode of the transistor 121 are controlled. As a result, good display quality is achieved. Details of this will be described below.

According to this embodiment, a period longer than a scanning period, for example, two horizontal scanning periods can be allocated as a period during which the transistor 125 is on, that is, a reset period of the OLED 130. This allows the voltage held by the parasitic capacitance of the OLED 130 during a light emitting period to be sufficiently initialized.

According to this embodiment, in the current Ids supplied to the OLED 130 by the transistor 121, the influence of the threshold voltage on the current Ids is offset. Therefore, according to this embodiment, if the threshold voltage of the transistor 121 varies for every pixel circuit 110, the variation is compensated for and a current having a value in accordance with a gray scale level is supplied to the OLED 130. Display unevenness that impairs the display uniformity of a display screen is therefore inhibited. As a result, high-quality display may be achieved.

Furthermore, according to this embodiment, the connection portion between the gate electrode of the transistor 121 and another transistor or the storage capacitor is surrounded on four sides by the initializing power supply line 16. Even if noise occurs because of variations in the potential of the data line 14 or other reasons, the noise has no influence on the connection portion between the gate electrode of the transistor 121 and another transistor or the storage capacitor, and variations in the potential of the gate electrode of the transistor 121 are controlled. As a result, poor display such as display unevenness may be reduced.

Structure of Pixel Circuit

Figure 5:
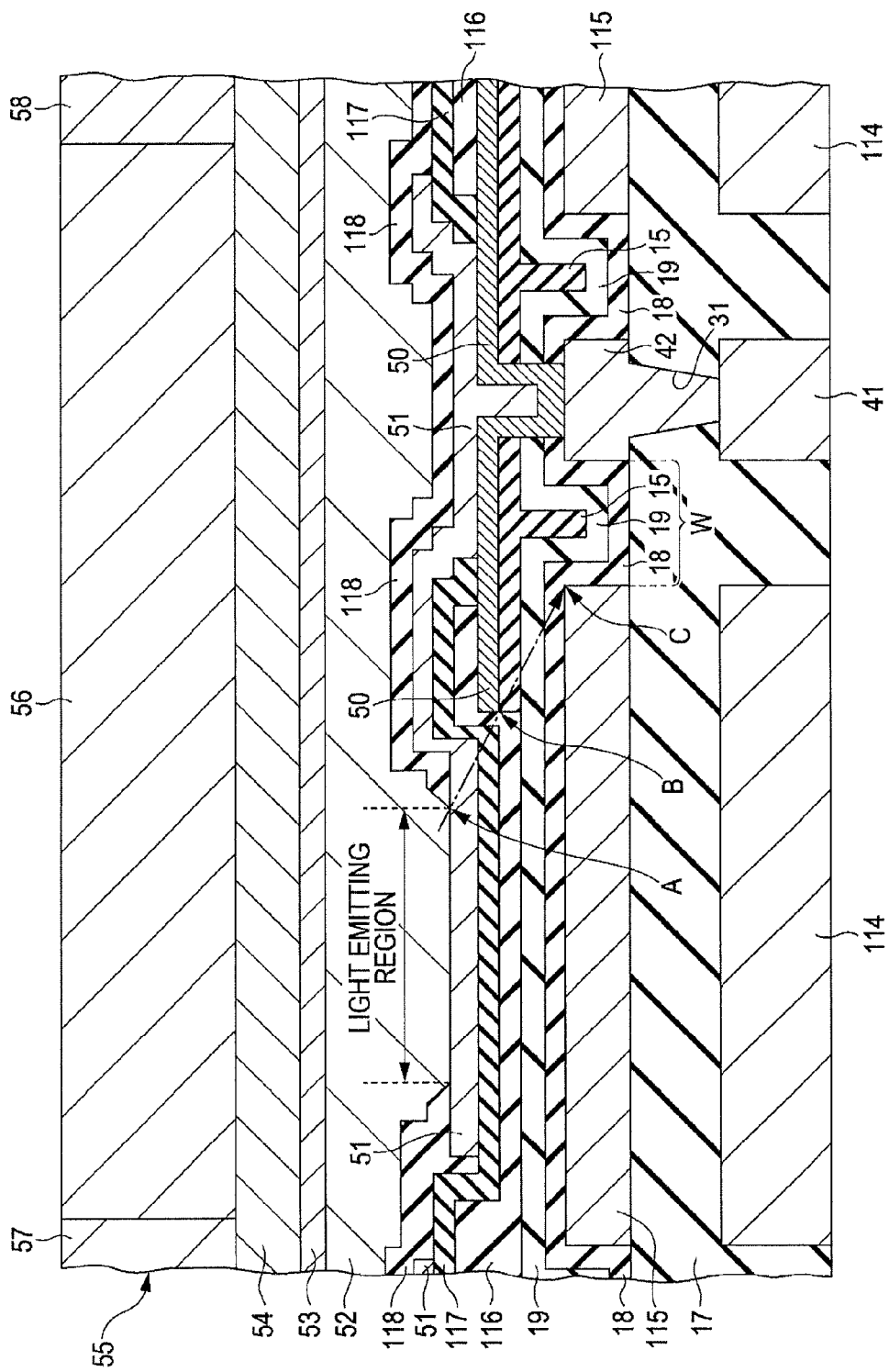
FIG. 5 is a plan view illustrating a configuration of the pixel circuit in the electro-optical device.

With reference to FIG. 5, the structure of the pixel circuit 110 will be described next. FIG. 5 is a plan view illustrating a configuration from an interlayer insulating film to a color filter layer of one pixel circuit 110. Note that a power supply wiring line, relay electrodes, an interlayer insulating film, the substrate in which transistors are formed, and so forth are laminated under the interlayer insulating film (not illustrated). Additionally, in the drawings referred to hereinafter, the scales of layers, members, and regions are changed so that each of the layers, members, and regions can be recognized.

As illustrated in FIG. 5, wiring 114 and a relay electrode 41 are formed on an interlayer insulating film underlying these components, and a first interlayer insulating film 17 is formed in such a manner as to cover the whole surface of these wiring 114 and the relay electrode 41. The relay electrode 41 is an electrode connected via a plurality of relay electrodes and contact holes to the source node of the transistor 124 in a layer lower than the relay electrode 41.

A reflective layer 115 and a relay electrode 42, which are made of a reflective conductive material such as a titanium/aluminum (Ti/Al) alloy, are formed on the surface of the first interlayer insulating film 17. The relay electrode 42 is electrically connected via a contact hole 31, which is formed in the first interlayer insulating film 17, to the relay electrode 41. The relay electrode 42 is disposed in an opening provided in the reflective layer 115 and is surrounded on four sides by the reflective layer 115. A second interlayer insulating film 18 made of silicon oxide ($SiO_2$) is formed in such a manner as to cover the reflective layer 115 and the relay electrode 42, and further a third interlayer insulating film 19 made of silicon nitride (SiN) is formed in such a manner as to cover the second interlayer insulating film 18. An interlayer adjustment film 15 made of silicon oxide ($SiO_2$) is formed on the third interlayer insulating film 19.

Then, after an area on the relay electrode 42 is opened, a light shielding layer 50 made of titanium nitride (TiN) or a titanium nitride/aluminum/titanium nitride (TiN/aluminum/TiN) alloy is formed in the area. The light shielding layer 50 also functions as a contact electrode with which the relay electrode 42 and an anode 51 made of ITO are electrically connected. In contrast, on the third interlayer insulating film 19 formed above the reflective layer 115, a first optical adjustment layer 116 made of silicon oxide ($SiO_2$) and a second optical adjustment layer 117 made of silicon oxide ($SiO_2$) are formed.

The anode 51 made of indium tin oxide (ITO) of the OLED 130 is formed on the above-mentioned light shielding layer 50 and second optical adjustment layer 117. A pixel separation layer 118 made of silicon nitride (SiN) is formed on the anode 51. Then, an organic functional layer 52 including a light emitting layer is formed in such a manner as to cover the above-mentioned anode 51 and pixel separation layer 118. The organic functional layer 52 is formed of an organic EL material in which holes and electrons combine together and light is emitted. An organic EL material is a low-molecular material and emits white light.

A cathode 53 made of a magnesium/aluminum (Mg/Al) alloy is formed on the organic functional layer 52, a sealing layer 54 for protecting the organic functional layer and the cathode 53 from oxygen or moisture is formed on the cathode 53, and a color filter layer 55 is formed on the sealing layer 54. A green color filter 57, a red color filter 56, and a blue color filter 58 are formed in this color filter layer 55, for example.

In such a manner, a pixel of this embodiment includes the cathode 53, which is an optical extraction side electrode, on the organic functional layer 52. The pixel has a resonance structure of adjusting the optical path length between the above-mentioned reflective layer 115 and the cathode 53, which is an optical extraction side electrode, by using an adjustment layer such as the first optical adjustment layer 116 and the second optical adjustment layer 117.

In the pixel circuit 110 having such a structure as described above, as illustrated in FIG. 5, a gap W is formed between the reflective layer 115 and the relay electrode 42. For this reason, it is conceivable that light emitted from a light emitting region leaks into the gap W. In this embodiment, however, the light shielding layer 50 formed of titanium nitride (TiN) extends from the relay electrode 42 to a location where the light shielding layer 50 covers part of the reflective layer 115, so that the gap W is covered. This reliably prevents light leakage.

It is also conceivable that a light shielding layer is provided in a layer lower than the relay electrode 42 and the reflective layer 115. Unfortunately, if a light shielding layer is provided in such a lower layer, a gap is generated between ends of the light shielding layer and an upper layer when seen in a sectional view such as FIG. 5. This results in an increase in gap. Also, if a light shielding layer is provided in a layer lower than the relay electrode 42 and the reflective layer 115, pattern formation is difficult in consideration of relay electrodes and other wiring. However, in this embodiment, since the contact electrode of the relay electrode 42 and the anode 51 is used as the light shielding layer 50, the relay electrode 42 and the light shielding layer 50 are connected, and a region on the relay electrode 42 will be completely covered with the light shielding layer 50. In addition, relay electrodes in a lower layer need not be considered, and therefore pattern formation is easily made.

The position of an edge B on a light emitting region side of the light shielding layer 50 is determined as follows. Of light that enters from the light emitting region, incident light that passes through an edge A of the light emitting region and reaches an edge C on a reflective layer side of the gap W is configured such that this incident light impinges upon the edge B on the light emitting region side of the light shielding layer 50, as indicated by the arrow of a dashed dotted line in FIG. 5. That is, the light shielding layer 50 may be formed so as to be located on an optical path of light that enters from the edge A on a relay electrode side of the organic functional layer 52 towards the edge C on the reflective layer side of the gap W.

With such a configuration, light that enters at an angle closer to the vertical than the incident light indicated by the arrow of a dashed dotted line in FIG. 5 does not reach the gap W, and the incident light indicated by the arrow of a dashed dotted line in FIG. 5 and light that enters at an angle closer to the horizontal than the incident light are blocked by the light shielding layer 50 and, as a result, do not enter the gap W.

Note that, although the refractive indexes of the anode 51, the optical adjustment layers 116 and 117, the second interlayer insulating film 18, and the third interlayer insulating film 19 are nearly equal in this embodiment, this is not inevitable. Even if their refractive indexes are different, the light shielding layer 50 that blocks light may be formed on the optical path of light that enters from the edge A towards the edge C on the reflective layer side of the gap W. As described above, a contact electrode connecting the relay electrode 42 to the anode 51 extends so as to cover the gap formed between the relay electrode 42 and the reflective layer 115, and this contact electrode is used as the light shielding layer 50. This reliably prevents light leakage, and thus the top-emission type electro-optical device 10 that is high in display quality may be provided.

Moreover, although the reflective layer 115 is formed of the same conductive material as the relay electrode 42, it is preferable to supply the potential Vel or the potential Vct to the reflective layer 115. In this case, the reflective layer 115 can be operated as a shield electrode, enabling noise that jumps into the relay electrode 42 to be reduced. As a result, an accurate current may be supplied to an OLED element, and thus display quality may be improved.

Applications and Modifications

The invention is not limited to the above embodiment, applications, and the like. Various modifications as described below, for example, may be made. Among examples of modifications described below, one or a plurality of examples arbitrarily selected may be appropriately combined.

Control Circuit

In the embodiment, the control circuit 5 that supplies data signals is formed separately from the electro-optical device 10. However, the control circuit 5, together with the scanning line driving circuit 20, the demultiplexer 30, and a level shift circuit 40, may be integrated in a silicon substrate.

Substrate

In the configuration of the embodiment, the electro-optical device 10 is integrated in a silicon substrate. Another configuration in which this device is integrated in another semiconductor substrate may be used. In addition, this device may be formed in a glass substrate or the like by application of a polysilicon process. Any of these ways is effective for such a configuration that the pixel circuit 110 is miniaturized and, in the transistor 121, variations in drain current are exponentially large relative to variations in the gate voltage Vgs.

Control Signal Gcmp(i)

In the embodiment and the like, regarding the i-th row, the control signal Gcmp(i) is at level H during the writing period. However, the control signal Gcmp(i) may be at level L. That is, there may be used a configuration in which compensation for the threshold caused by the transistor 123 turning on is performed in parallel with writing to the node gate g.

Channel Types of Transistors

In the foregoing embodiment, the transistors 121 to 125 in the pixel circuit 110 are uniformly of the p-channel type. However, they may be uniformly of the n-channel type. The p-channel transistors and the n-channel transistors may also be combined appropriately.

Miscellaneous

In the embodiment and the like, the OLED, which is a light emitting element, has been illustrated as an electro-optical device. However, any element that emits light with luminance in accordance with current, such as an inorganic light emitting diode or a light emitting diode (LED), may be used.

Electronic Apparatus

An electronic apparatus to which the electro-optical device 10 according to the embodiment or the like, or an application example, is applied will be described next. The electro-optical device 10 is suitable for applications in which high definition display is desirable with small-size pixels. Accordingly, a head-mounted display will be described by way of example as an electronic apparatus.

Figure 6:
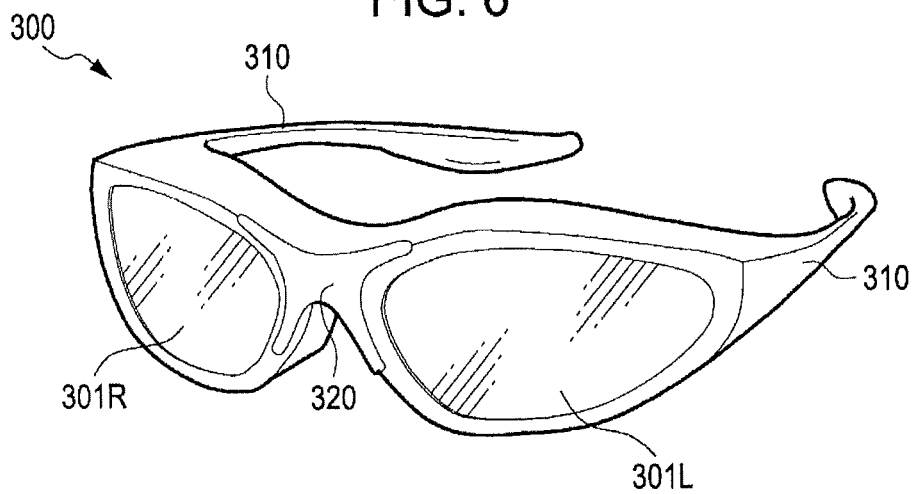
Figure 7:
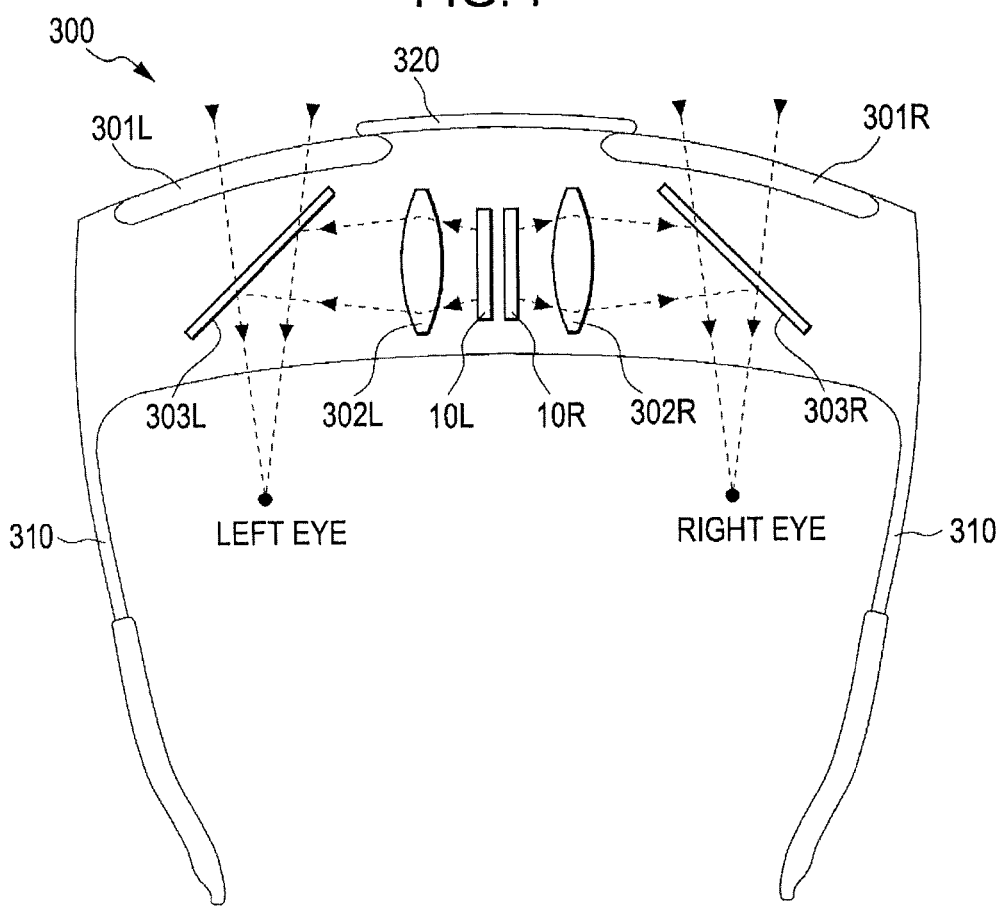
FIG. 7 illustrates an optical configuration of the HMD.

FIG. 6 illustrates the external appearance of a head-mounted display, and FIG. 7 illustrates an optical configuration of the head-mounted display. As illustrated in FIG. 6, a head-mounted display 300 includes temples 310, a bridge 320, and lenses 301L and 301R, like typical glasses in terms of the external appearance. In addition, as illustrated in FIG. 7, the head-mounted display 300 is provided with an electro-optical device 10L for a left eye and an electro-optical device 10R for a right eye near the bridge 320 and on a back side (on a lower side in the drawing) of the lenses 301L and 301R, respectively. The image display surface of the electro-optical device 10L is disposed to the left of FIG. 7. This causes a display image created by the electro-optical device 10L to travel through an optical lens 302L in the direction of 9:00 in the drawing. A half mirror 303L reflects the display image from the electro-optical device 10L in the direction of 6:00, and allows light that has entered from the direction of 12:00 to pass therethrough. The image display surface of the electro-optical device 10R is disposed to the right of the drawing, which is opposite to the image display surface of the electro-optical device 10L. This causes a display image created by the electro-optical device 10R to travel through an optical lens 302R in the direction of 3:00 in the drawing. A half mirror 303R reflects the display image from the electro-optical device 10L in the direction of 6:00, and allows light that has entered from the direction of 12:00 to pass therethrough.

With this configuration, a person wearing the head-mounted display 300 can observe display images created by the electro-optical devices 10L and 10R in a see-through state in which the display images are superimposed over the outside scene. When, in the head-mounted display 300, one of both eyes' images with a parallax, that is, an image for a left eye is displayed on the electro-optical device 10L and the other, that is, an image for a right eye is displayed on the electro-optical device 10R, a person wearing the head-mounted display 300 can perceive a displayed image as if this image had depth and a cubic effect (three dimensional (3D) display).

Note that the electro-optical device 10 is applicable to an electronic view finder in a video camera, an interchangeable lens digital camera, and the like, in addition to the head-mounted display 300.

The entire disclosure of Japanese Patent Application No. 2012-111568, filed May 15, 2012 is expressly incorporated by reference herein.

What is claimed is:

1. An electro-optical device comprising:
a substrate;
a first insulating film provided above the substrate;
a reflective layer provided on the first insulating film;
a second insulating film provided above the reflective layer, the second insulating film having a first contact hole;
a contact electrode electrically connected to a transistor through the first contact hole, the contact electrode being provided on the second insulating film;
a first optical adjustment layer provided on the contact electrode and the second insulating film;

a second optical adjustment layer provided on the first optical adjustment layer, the first optical adjustment layer and the second optical adjustment layer having a second contact hole;

an anode provided on the contact electrode and the second optical adjustment layer, the anode electrically contacting the contact electrode through the second contact hole;

an organic functional layer provided on the anode, the organic functional layer including a light emitting layer; and a cathode provided on the organic functional layer, wherein the first optical adjustment layer, the second optical adjustment layer, and the anode are positioned between the reflective layer and the cathode.

2. The electro-optical device according to claim 1, wherein the contact electrode is made of titanium nitride.

3. The electro-optical device according to claim 1, wherein the second insulating film is made of silicon nitride.

4. The electro-optical device according to claim 3, wherein the first optical adjustment layer is made of silicon oxide, and the second optical adjustment layer is made of silicon oxide.

5. The electro-optical device according to claim 3, wherein the reflective layer includes aluminum.

6. The electro-optical device according to claim 5, further comprising:

a third insulating film provided between the reflective layer and the second insulating film.

7. The electro-optical device according to claim 6, wherein the third insulating film is made of silicon oxide.

8. The electro-optical device according to claim 1, wherein the anode is made of indium tin oxide.

9. An electronic apparatus comprising the electro-optical device according to claim 1.

10. An electronic apparatus comprising the electro-optical device according to claim 2.

11. An electronic apparatus comprising the electro-optical device according to claim 3.

12. An electronic apparatus comprising the electro-optical device according to claim 4.

13. An electronic apparatus comprising the electro-optical device according to claim 5.

14. An electronic apparatus comprising the electro-optical device according to claim 6.

15. An electronic apparatus comprising the electro-optical device according to claim 7.

16. An electronic apparatus comprising the electro-optical device according to claim 8.

* * * * *